United States Patent [19]
Tsunai

[11] Patent Number: 5,444,281
[45] Date of Patent: Aug. 22, 1995

[54] CHARGE TRANSFER DEVICE CAPABLE OF SUPPRESSING RESET NOISE

[75] Inventor: Shiro Tsunai, Tokyo, Japan

[73] Assignee: NEC Corporation

[21] Appl. No.: 63,750

[22] Filed: May 20, 1993

[30] Foreign Application Priority Data

May 20, 1992 [JP] Japan .................... 4-127006

[51] Int. Cl.6 .................... H01L 29/796; G11C 19/28
[52] U.S. Cl. .................... 257/239; 377/60
[58] Field of Search .................... 257/239; 377/60

[56] References Cited

U.S. PATENT DOCUMENTS

| | | | |
|---|---|---|---|
| 4,074,302 | 2/1978 | Brewer | 257/239 |
| 5,223,723 | 6/1993 | Miwada | 257/239 |
| 5,229,630 | 7/1993 | Hamasaki | 257/239 |

*Primary Examiner*—Gene M. Munson
*Attorney, Agent, or Firm*—Popham, Haik, Schnobrich & Kaufman, Ltd.

[57] ABSTRACT

In a charge transfer device incorporating a charge-coupled device, a junction type field-effect transistor, and a reset transistor, the junction type field-effect transistor includes a source region in contact with a junction gate region and a drain region in contact with the junction gate region. The charge-coupled device has an output gate electrode on a first insulation film formed on a surface of a transfer channel region which is formed in contact with the junction gate region. The reset transistor has a reset gate electrode adjacent to the junction gate region with a second insulation film interposed between the junction gate region and the reset gate electrode. A first distance between the source region and each of the output gate electrode and the reset gate electrode is longer than a second distance between the source region and the drain region.

11 Claims, 4 Drawing Sheets

CHARGE TRANSFER DEVICE CAPABLE OF SUPPRESSING RESET NOISE

BACKGROUND OF THE INVENTION

This invention relates to a charge transfer device fabricated on a semiconductor substrate. In particular, this invention relates to a structure of an output section of the charge transfer device.

A charge transfer device comprises a charge-coupled device (CCD), a junction type field-effect transistor, and a reset transistor. The charge-coupled device, the junction type field-effect transistor, and the reset transistor are fabricated on a semiconductor substrate.

The charge-coupled device comprises a transfer channel region isolated by a channel stopping region of a first conductivity type and diffused with a second conductivity type into a well region of the first conductivity type. The well region is formed on a surface of the semiconductor substrate of the second conductivity type. An output gate electrode is arranged on a first insulation film formed on a surface of the transfer channel region. The output gate electrode has its edge aligned with an output end of the transfer channel.

The junction type field-effect transistor comprises a junction gate region formed with the second conductivity type in contact with the transfer channel region at an output end of the charge-coupled device. A source region of the second conductivity type reaches the well region in contact with the junction gate region. In a conventional charge transfer device, a drain region is a part of the channel stopping region. The source region is connected to a load and an output terminal of the charge transfer device. The drain region is grounded. A hole current flows from the source region to the drain region through the well region.

The reset transistor comprises a reset gate electrode adjacent to the junction gate region. The reset gate electrode has its edge aligned with an edge of the junction gate region. The reset gate electrode is arranged on a second insulation film interposed between the junction gate region and the reset gate electrode.

The charge-coupled device transfers electric charges supplied from an input device, such as a CCD image sensor. The charge-coupled device supplies the electric charges to the junction gate region of the junction type field-effect transistor. The junction gate region stores the electric charges as stored electric charges. The stored electric charges modulate the hole current. An electric potential of the output terminal varies according to the stored electric charges. The electric potential is detected as an output signal. The reset transistor resets the junction gate region of the junction type field-effect transistor.

It is difficult in the conventional charge transfer devices to align the edge of the output gate electrode correctly with the output end of the transfer channel region, and to align the edge of the reset gate electrode precisely with the edge of the junction gate region. Therefore, manufacturing errors are likely to occur.

Furthermore, conventional charge transfer devices are defective in that reset noise appears in their output signals. Moreover, the output signal has an output characteristic which is influenced by the storing of electric charges as a result of manufacturing error.

SUMMARY OF THE INVENTION

It is therefore an object of the present invention to provide a charge transfer device capable of suppressing reset noise.

It is another object of this invention to provide a charge transfer device capable of suppressing the influence of manufacturing errors.

Other objects of this invention will become clear as the description proceeds.

On describing the gist of this invention, it is possible to understand that a charge transfer device comprises a charge-coupled device comprising a transfer channel region isolated by a channel stopping region of a first conductivity type and diffused with a second conductivity type into a well region formed with the first conductivity type on a surface of a semiconductor substrate of the second conductivity type and an output gate electrode on a first insulation film formed on a surface of the transfer channel region, a junction type field-effect transistor comprising a junction gate region formed with the second conductivity type in contact with the transfer channel region at an output end of the charge-coupled device to cover a current channel in the well region, a source region reaching with the first conductivity type to the well region in contact with the junction gate region, and a drain region of the second conductivity type in contact with the channel stopping region and with the junction gate region, and a reset transistor comprising a reset gate electrode adjacent to the junction gate region with a second insulation film interposed between the junction gate region and the reset gate electrode.

According to this invention, a first distance between the source region and each of the output gate electrode and the reset gate electrode is longer than a second distance between the source region and the drain region.

DESCRIPTION OF THE PREFERRED EMBODIMENTS

Figure 1:
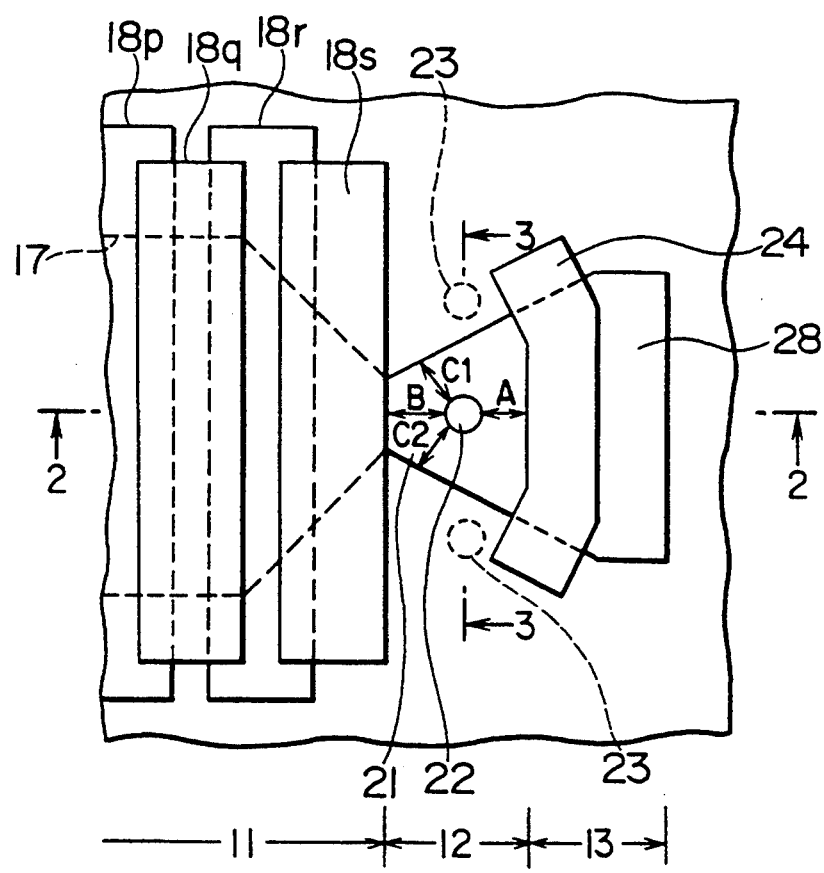
FIG. 1 is a top view of a conventional charge transfer device.
Figure 2:
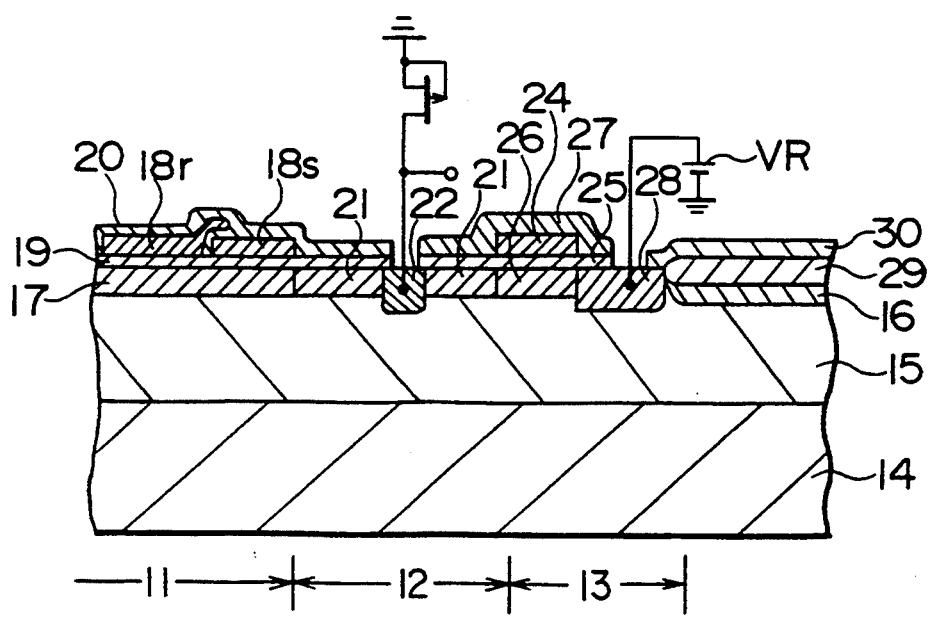
FIG. 2 is a vertical sectional view of the conventional charge transfer device taken on line 2—2 of FIG. 1.
Figure 3:
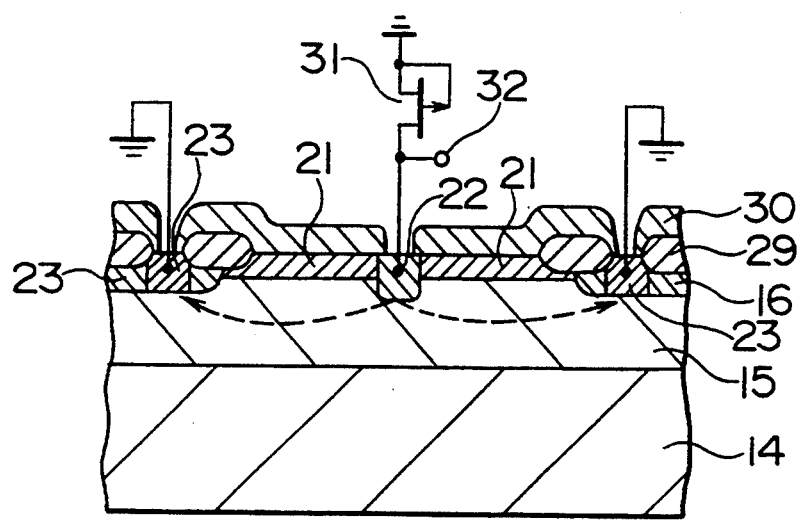
FIG. 3 is a vertical sectional view of the conventional charge transfer device taken on line 3—3 of FIG. 1.

Referring to FIGS. 1, 2, and 3, a conventional charge transfer device will first be described in order to facilitate an understanding of the present invention.

Such a conventional charge transfer device is disclosed in Japanese Patent Prepublication No. 154,328 of 1989. A like conventional charge transfer device is described in a paper contributed by Michihiro Morimoto and four others in the Japanese language to the ITEJ Technical Report, Volume 14, No. 16 (February 1990), pages 19-24, under the title of "Low Noise Charge Detector for CCD Image sensors".

In FIGS. 1 and 2, the charge transfer device comprises a charge-coupled device (CCD) 11, a junction type field-effect transistor 12, and a reset transistor 13. The charge-coupled device 11, the junction type field-effect transistor 12, and a reset transistor 13 are fabricated on a surface of a n-type silicon substrate 14. A p-type well region 15 is grown on a surface of the n-type silicon substrate 14. A p+-type channel stopping region 16 is diffused into the p-type well region 15.

The charge-coupled device 11 comprises a transfer channel region 17 isolated by the p+-type channel stopping region 16 and diffused with an n-type conductivity into the p-type well region 15. Transfer electrodes 18p, 18q, and 18r are arranged on a first oxide film 19 formed on a surface of the transfer channel region 17. An output gate electrode 18s is arranged on the first oxide film 19. The output gate electrode 18s has its edge aligned with an output end of the charge-coupled device 11. The transfer electrodes 18p, 18q, and 18r, and the output gate electrode 18s are covered by a first insulating film 20.

The junction type field-effect transistor (FET) 12 comprises a junction gate region 21 called a ring junction gate. The junction gate region 21 is formed with the n-type Conductivity in contact with the transfer channel region 17 at the output end of the charge-coupled device 11. A source region 22 of the p-type conductivity reaches the p-type well region 15. In the conventional charge transfer device, drain regions 23 are parts of the channel stopping region 16.

The reset transistor 13 comprises a reset gate electrode 24 on a surface of a second oxide film 25. The second oxide film 25 is formed on an n-type reset channel region 26 diffused into the p-type well region 15. The reset gate electrode 24 has an edge aligned with an edge of the junction gate region 21 and with the n-type reset channel region 26. The reset gate electrode 24 is covered with a second insulating film 27. The second oxide film 25 may be the first oxide film 19. The second insulating film 27 may be the first insulating film 20. A reset drain region 28 is diffused with the n-type conductivity into the p-type well region 15. The reset drain region 28 is connected to a reference power source VR. The reset transistor 13 utilizes the junction gate region 21 as a gate region.

The channel stopping region 16 is covered with a field oxide film 29 and a third insulating film 30. The field oxide film 29 may be the first oxide film 19. The third insulating film 30 may be the first insulating film 20.

The charge-coupled device 11 is supplied with electric charges from an input device (not shown), such as a CCD image sensor. The charge-coupled device 11 transfers the electric charges to the junction gate region 21 through the transfer channel region 17 in accordance with voltages supplied to the transfer electrodes 18p, 18q, and 18r and the output gate electrode 18s. The junction gate region 21 is loaded with the electric charges as stored charges.

The reset transistor 13 transfers the stored charges to the reset drain region 28 when the reset gate electrode 24 is supplied with a reset voltage. The junction gate region 21 is reset by the reset transistor 13.

In FIG. 3, the source region 22 is connected to a load 31, such as an FET, and to an output terminal 32. The drain regions 23 are grounded. The junction gate transistor 12 and the load 31 are used as a source follower. A hole current is sent from the source region 22 to the drain regions 23 through the well region 15 in accordance with an electric potential of the junction gate region 21. The hole current is modulated by the stored charges, because the electric potential depends on the stored charges. An output voltage depends on the stored charges is detected at the output terminal 32.

In FIG. 2, a source plane of the source region 22 will be presumed perpendicular to the surface of the n-type silicon substrate 14 adjacent to the reset gate electrode 24. A gate electrode plane of the reset gate electrode 24 will be presumed perpendicular to the surface of the n-type silicon substrate 14 adjacent to the source region 22. The source region 22 and the reset gate electrode 24 have a distance A between the source plane and the gate electrode plane. When two elements of such a charge transfer device are on different planes parallel to the surface of the n-type silicon substrate 14, such a distance will be taken in consideration.

In general, the hole current is easily influenced by the stored charges when the distance between the source region 22 and the drain region 23 is long. The hole current easily flows when the distance is short.

In FIGS. 1 and 2, a distance C1 (C2) will be taken in consideration between the source region 22 and the channel stopping region 16. When the distances C1 and C2 are longer than the distance A between the source region 22 and the reset gate electrode 24, the hole current is sent towards the output gate region 18s. In this event, the hole current is modulated by a reset pulse signal supplied to the reset gate electrode 24.

It is difficult to align the edge of the output gate electrode 18s correctly with the output end of the transfer channel 17 and to align the edge of the reset gate electrode 24 precisely with the edge of the reset channel 26. It is liable that the edge of the output gate electrode 18s slips from or misaligned with the output end of the transfer channel 17. The edge of the reset gate electrode 24 is similarly liable to slip from the edge of the reset channel 26. As a consequence, the distance A is not correctly defined. This gives rise to variations in an output characteristic of the conventional charge transfer device relative to the stored charges. This applies to another distance B between the source region 22 and the output gate electrode 18s.

A parasitic capacity appears between the junction gate region 21 and the reset gate electrode 24. The conventional charge transfer device has a sensitivity reduced by the parasitic capacity.

Figure 4:
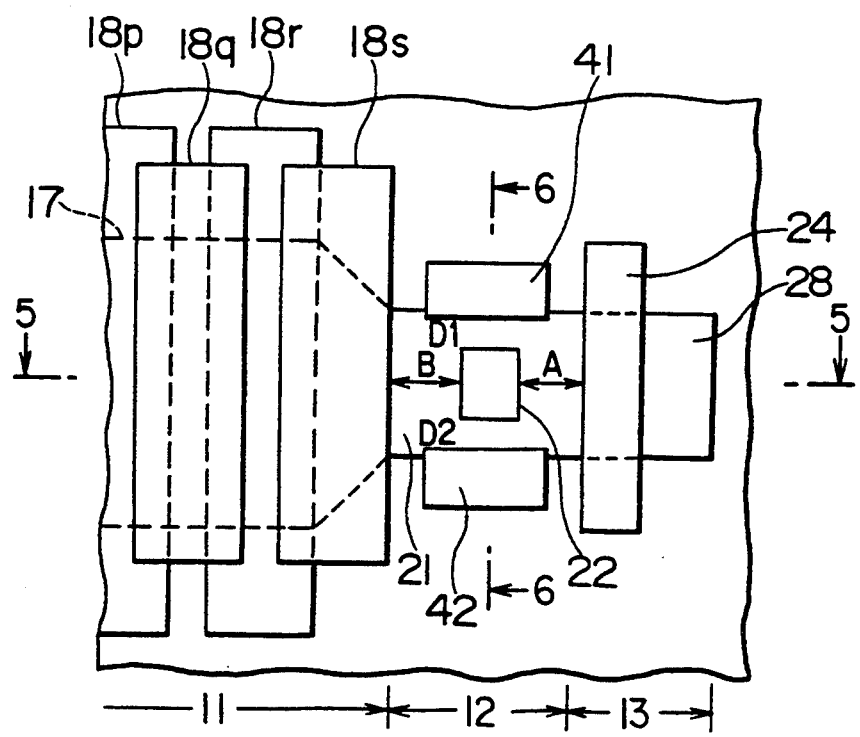
FIG. 4 is a top view of a charge transfer device according to a first embodiment of this invention.
Figure 5:
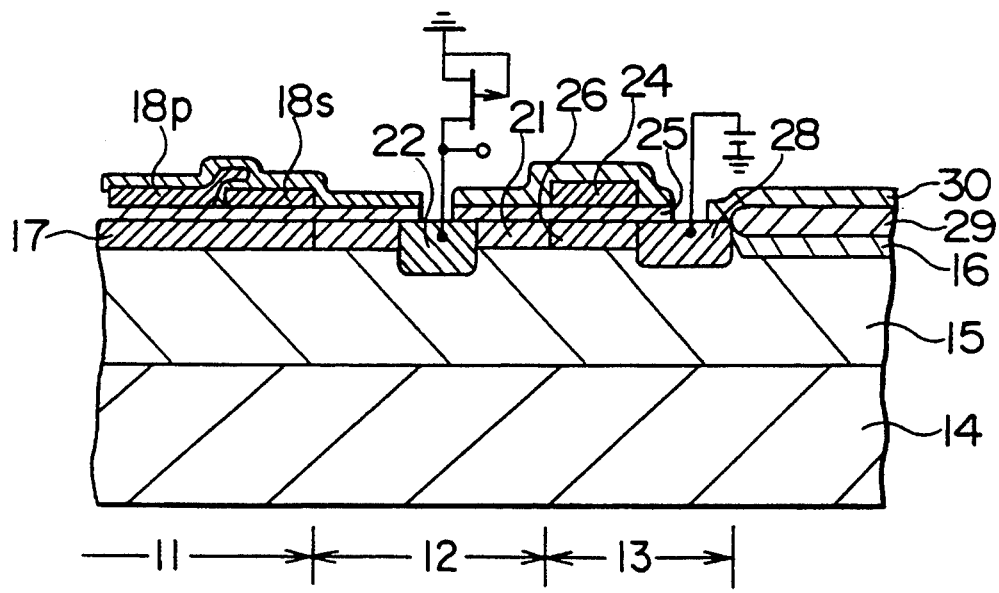
FIG. 5 is a vertical sectional view of the charge transfer device taken on line 5—5 of FIG. 4.
Figure 6:
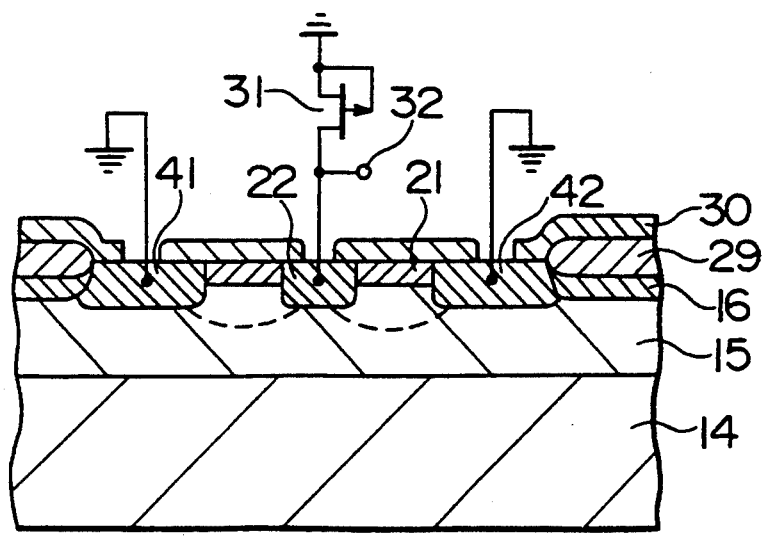
FIG. 6 is a vertical sectional view of the charge transfer device taken on line 6—6 of FIG. 4.

Referring to FIGS. 4, 5, and 6, the description will proceed to a charge transfer device according to a first embodiment of this invention. Similar parts are designated by like reference numerals. It should be noted that the junction gate region 21 and the reset gate electrode 24 are differently shaped.

The junction field-effect transistor 12 comprises a pair of drain regions 41 and 42. The drain regions 41 and 42 are diffused with a p-type conductivity into the well region 15 in contact with the channel stopping region 16 and with the junction gate region 21. The drain regions 41 and 42 give a narrow width to the junction gate region 21.

In FIG. 4, the source region 22 and the drain region 41 have a distance D1 which is equal to a distance D2 between the source region 22 and the drain region 42. For this purpose, the source region 22 and the drain regions 41 and 42 are diffused into the p-type well region 15 by using the same photo mask and the same process. It is possible that the distances D1 and D2 are sufficiently shorter than the distance A between the reset gate electrode 24 and the source region 22 and the distance B between the output gate electrode 18s and the source region 22. The hole current is thereby hardly influenced by manufacturing errors. The hole current is difficult to influence by a reset pulse signal, because the hole current hardly flows towards the reset gate electrode 24. For example, when an impurity concentration of the p-type well region 15 is equal to $3 \times 10^{15}$ cm$^{-3}$, the distances A and B are equal to 7 micrometers, and the distances D1 and D2 are equal to 6 micrometers, the charge transfer device produces an output signal with noise which is reduced by twenty percent of the noise included in the output signal of the conventional charge transfer device illustrated with reference to FIGS. 1 through 3.

Figure 7:
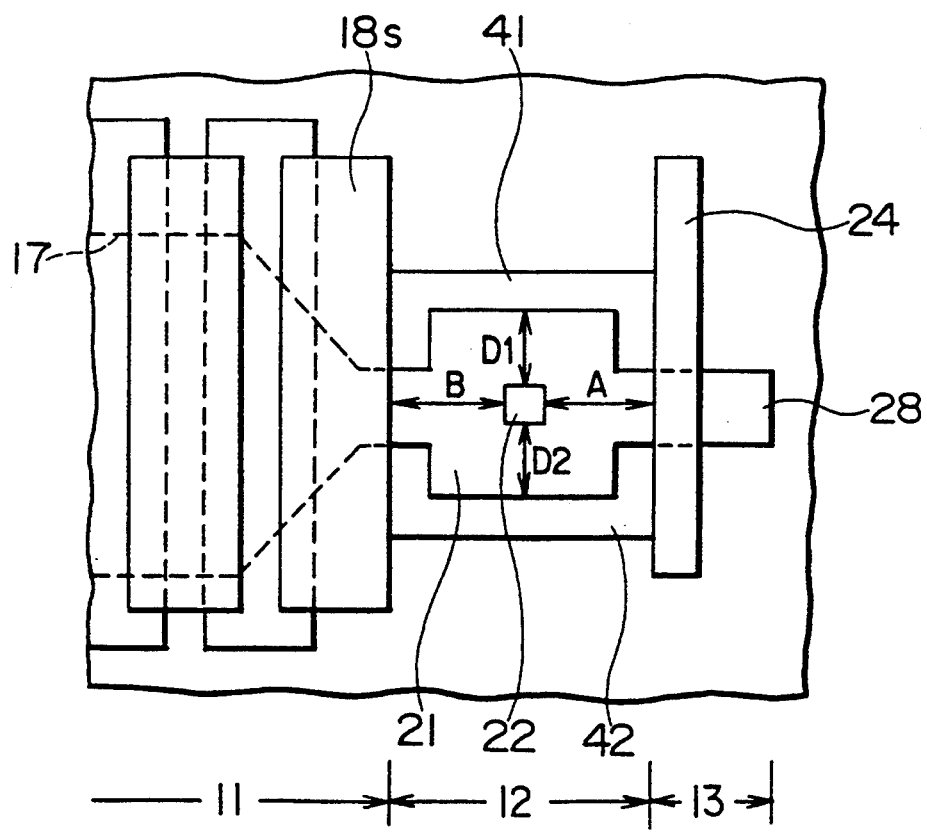
FIG. 7 is a top view of a charge transfer device according to a second embodiment of this invention.

Referring to FIG. 7, attention will be directed to a charge transfer device according to a second embodiment of this invention. Similar parts are designated by like reference numerals.

The junction gate region 21 and the drain regions 41 and 42 are differently shaped. The junction gate region 21 comprises a square area and two jut areas. The square area has sides parallel and perpendicular to the output end of the transfer channel region 17. The jut areas are protruded towards and away from the output end of the transfer channel region 17. The square area and the jut areas are surrounded by the drain regions 41 and 42.

Inasmuch as the junction gate region 21 has the jut areas, the distances A and B are longer than the distances D1 and D2. In this structure, the hole current is hardly influenced by misalignment between the output gate electrode 18s and the transfer channel region 17 and between the reset gate electrode 24 and the reset channel 26. The output signal thereby is scarcely influenced by a reset pulse signal, because parts of the drain regions 41 and 42 exist partly between a source region 22 and a reset gate electrode 24.

In the charge transfer device, a current channel region is formed between the source region 22 and each of the drain regions 41 and 42 in the manner depicted by a dashed line in FIG. 6. The current channel region has a large width parallel to the output end of the transfer channel region 17. Furthermore, the charge transfer device has small parasitic capacitances between the junction gate region 21 and the output gate electrode 18s and between the junction gate region 21 and the reset gate electrode 24. The charge transfer device consequently has a raised sensitivity of detecting the stored charges. The sensitivity is increased by ten percent over that of the above-described conventional transfer device.

What is claimed is:

1. A charge transfer device comprising: (a) a charge-coupled device comprising a transfer channel region isolated by a channel stopping region of a first conductivity type and diffused with a second conductivity type into a well region formed with said first conductivity type on a surface of a semiconductor substrate of said second conductivity type and an output gate electrode on a first insulation film formed on a surface of said transfer channel region, (b) a junction type field-effect transistor comprising a junction gate region formed with said second conductivity type in contact with said transfer channel region at an output end of said charge-coupled device to cover a current channel in said well region, a source region reaching with said first conductivity type to said well region in contact with said junction gate region, and a drain region of said first conductivity type in contact with said channel stopping region and with said junction gate region, and (c) a reset transistor comprising reset channel and a reset gate electrode which is located over said reset channel and which is adjacent to said junction gate region with a second insulation film interposed between said reset gate electrode and both of said junction gate region and the reset channel, wherein:

a first distance between said source region and each of said output gate electrode and said reset gate electrode is longer than a second distance between said source region and said drain region.

2. A charge transfer device as claimed in claim 1, said drain region being a first drain region, said second distance being a second primary distance, said junction type field-effect transistor comprising a second drain region formed with said second conductivity type in contact with said channel stopping region and with said junction gate region and spaced from said first drain region, wherein:

said first distance is longer than a second secondary distance between said source region and said second drain region.

3. A charge transfer device as claimed in claim 2, wherein said second primary distance is equal to said second secondary distance.

4. A charge transfer device as claimed in claim 1, wherein said second conductivity type is an n-type conductivity, said semiconductor substrate being a silicon substrate.

5. A charge transfer device as claimed in claim 1, wherein a single reset region comprises said junction gate region and the reset channel.

6. A charge transfer device fabricated on a semiconductor substrate of a first conductivity type and including: (a) a charge-coupled device comprising a transfer channel diffused with said first conductivity type into a well region formed with a second conductivity type on said semiconductor substrate and an output gate electrode on a first insulation layer formed on a surface of said transfer channel, (b) a junction field-effect transistor comprising a ring-shaped junction gate region diffused with said first conductivity type into said well region at an output end of said transfer channel, a source region of said second conductivity type centrally of said ring-shaped junction gate region, and a drain region of said second conductivity type in contact with said ring-shaped junction gate region, (c) a reset transistor comprising a reset channel and a reset gate electrode which is located over said reset channel and which is adjacent to said ring-shaped junction gate region with a second insulation layer interposed between said reset gate electrode and both of said ring-shaped junction gate region and the reset channel, wherein:

a first distance between said source region and each of said output gate electrode and said reset gate electrode is longer than a second distance between said source region and said drain region.

7. A charge transfer device as claimed in claim 6, said drain region being a first drain region, said second distance being a second primary distance, said junction type field-effect transistor comprising a second drain region formed in contact with said ring-shaped junction gate region and spaced from said first drain region, wherein:

said first distance is longer than a second secondary distance between said source region and said second drain region.

8. A charge transfer device as claimed in claim 7, wherein said second primary distance is equal to said second secondary distance.

9. A charge transfer device as claimed in claim 6, wherein said semiconductor substrate is an n-type silicon substrate.

10. A charge transfer device as claimed in claim 6, wherein a single reset region comprises said ring-shaped junction gate region and the reset channel.

11. A charge transfer device fabricated on a semiconductor substrate of a first conductivity type and including: (a) a charge-coupled device comprising a transfer channel diffused with said first conductivity type into a well region formed with a second conductivity type on a said semiconductor substrate and an output gate electrode arranged on a first insulation layer formed on a surface of said transfer channel, (b) a junction field-effect transistor comprising a ring-shaped junction gate region diffused with said first conductivity type into said well region at an output end of said transfer channel, a source region of said second conductivity type centrally of said ring-shaped junction gate region, and a drain region of said second conductivity type in contact with said ring-shaped junction gate region, and (c) a reset transistor comprising a reset channel diffused into said well region in contact with said ring-shaped junction gate region, a reset gate electrode adjacent to said ring-shaped junction gate region and on a second insulation layer formed on said reset channel, and a reset drain region of said first conductivity type diffused into said well region in contact with said reset channel and adjacent to said reset gate electrode;

a first distance between said source region and each of said output gate electrode and said reset gate electrode is longer than a second distance between said source region and said drain region of said junction field-effect transistor.

* * * * *